United States Patent [19]

Adam

[11] Patent Number: 4,686,558
[45] Date of Patent: Aug. 11, 1987

[54] CMOS MEMORY CELL HAVING AN ELECTRICALLY FLOATING STORAGE GATE

[75] Inventor: Fritz G. Adam, Freiburg, Fed. Rep. of Germany

[73] Assignee: ITT Industries, Inc., New York, N.Y.

[21] Appl. No.: 528,431

[22] Filed: Sep. 1, 1983

[30] Foreign Application Priority Data

Sep. 15, 1982 [EP] European Pat. Off. ........ 82108483.7

[51] Int. Cl.$^4$ ............................................. H01L 29/78
[52] U.S. Cl. ..................................... 357/42; 357/23.5; 365/181
[58] Field of Search ............... 357/23.5, 42, 45; 365/181, 184, 185

[56] References Cited

U.S. PATENT DOCUMENTS

| | | | |
|---|---|---|---|
| 4,016,588 | 4/1977 | Ohya et al. | 357/23.5 |
| 4,037,242 | 7/1977 | Gosney | 357/42 |
| 4,112,506 | 9/1978 | Zibu | 365/181 |

FOREIGN PATENT DOCUMENTS

| | | | |
|---|---|---|---|
| 54-16138 | 2/1979 | Japan | |
| 54-078679 | 8/1979 | Japan | 357/23.5 |
| 5494574 | 7/1981 | Japan | 365/181 |

OTHER PUBLICATIONS

Johnson, W. S., Perlegos, G., Renninger, A., Kuhn, G., and Ranganath, T. R., "A 16Kb Electrically Erasable Nonvolatile Memory", IEEE International Solid-State Circuits Conference Digest, 1980, pp. 152-153.

Stewart, R. G., and Plus, D., "A 40ns CMOS E$^2$-PROM", IEEE International Solid-State Circuits Conference Digest, 1982, pp. 110-111.

Medwin, L. B. and Ipri, A. C., "FACMOS EAROM", RCA Technical Notes, No. 1185, Jun. 1977, pp. 1–4.

Primary Examiner—Martin H. Edlow
Assistant Examiner—Sara W. Crane
Attorney, Agent, or Firm—Thomas L. Peterson

[57] ABSTRACT

An electrically programmable memory cell contains a source-drain series arrangement of a field-effect select transistor arrangement and a complementary pair of memory transistors arranged between a first bit line and a second bit line. The pair of memory transistors comprises a common electrically floating storage gate and a common control gate which is connected to one programming line. Each of the electrodes of the select transistors is connected to the row selecting line associated therewith. The drain regions which are connected to one another, are lead to a read line. The memory cell according to the invention permits reading without requiring any significant DC power, and programming by using the complete programming voltage as available.

15 Claims, 8 Drawing Figures

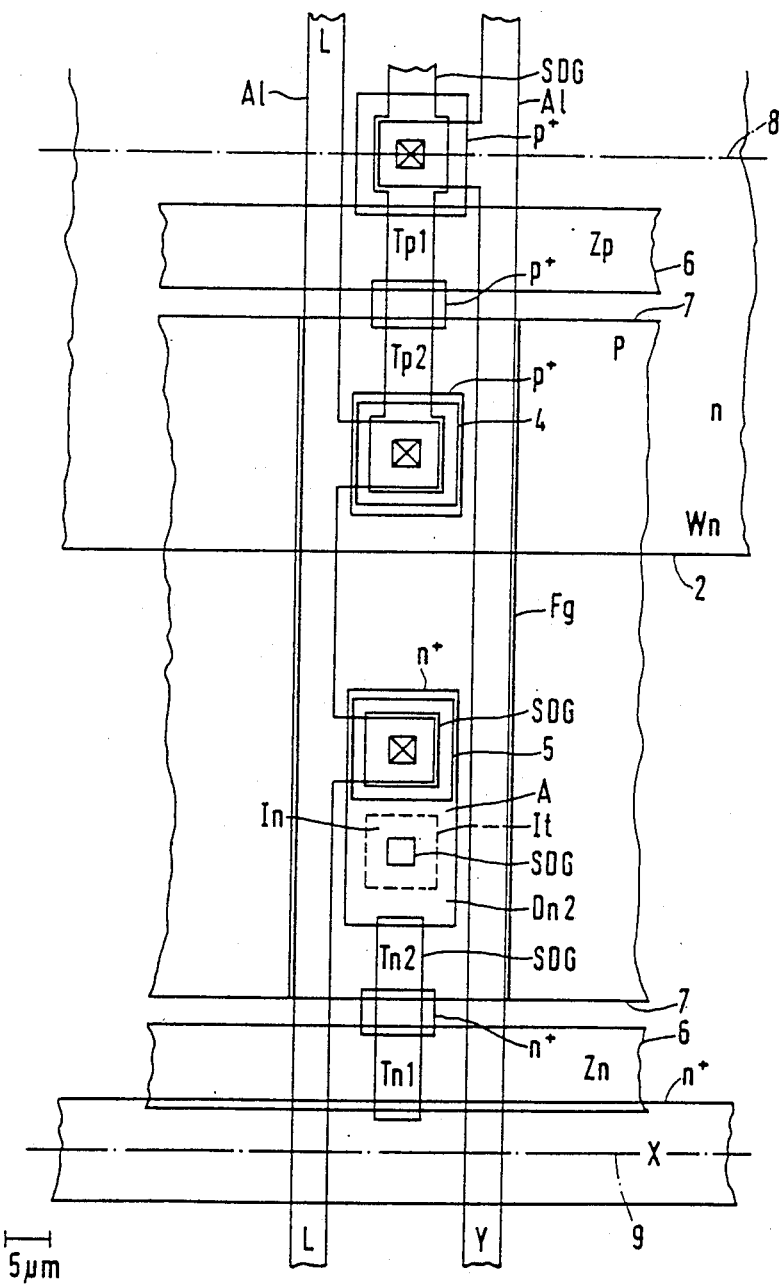

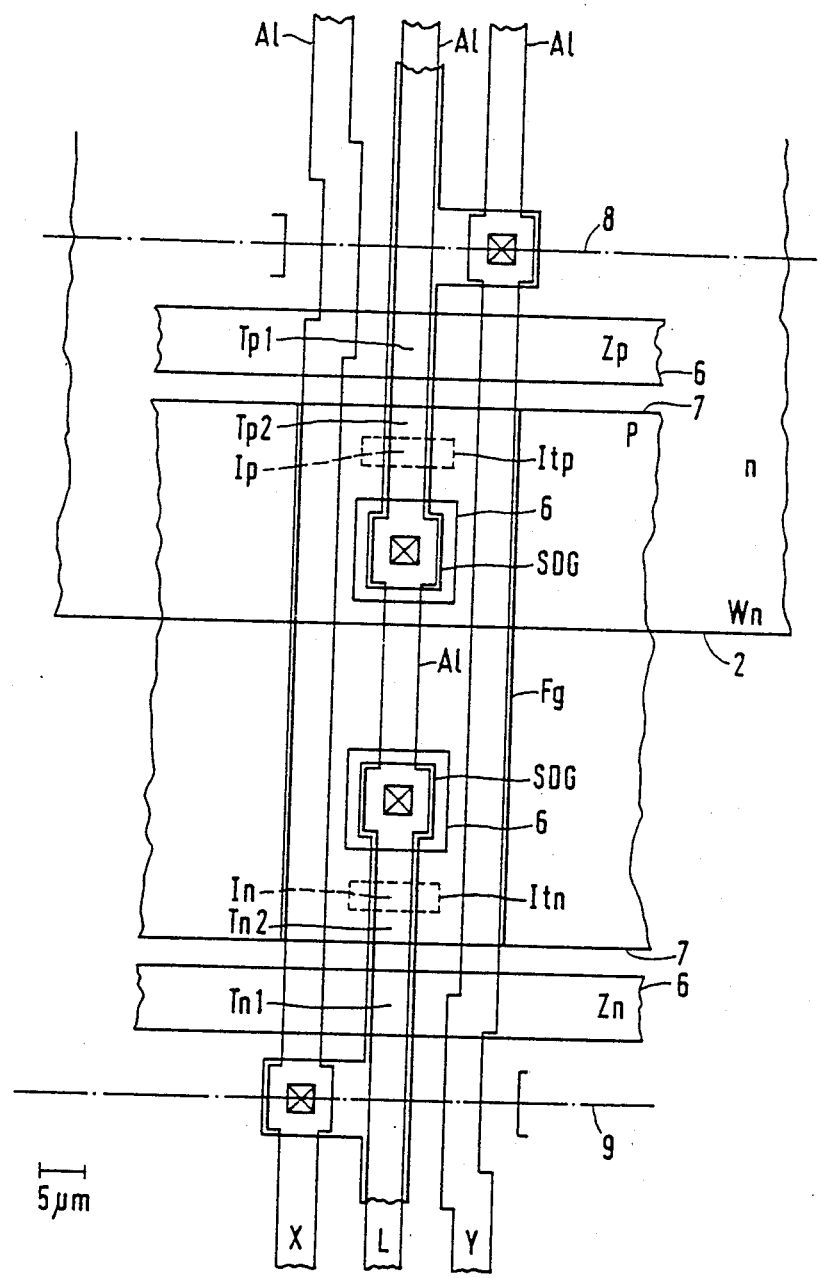

CMOS MEMORY CELL HAVING AN ELECTRICALLY FLOATING STORAGE GATE

BACKGROUND OF THE INVENTION

Nonvolatile semiconductor memory cells which require only very small programming currents are of particular interest where it is desirable to minimize the dissipated power in electrically programmable memory matrices (EEPROM). In this category of memory cells are MNOS memory cells and memory cells with an electrically floating storage gate which are recharged via tunnel injector. The latter have the advantage over MNOS memory cells, of having better retention and endurance times. The retention time relates to the period of maintaining the stored data (retention) and the endurance time indicates the number of reprogramming operations (endurance) which can be performed without causing any damage. A memory cell of the last-mentioned kind is described in the technical journal "Electronics" of Feb. 28, 1980, pp. 113 to 117. These so-called "floating gate" memory cells are popular with both users and manufacturers, because their manufacturing technique has a higher degree of compatibility with modern standard technologies.

The "1980 IEEE International Solid-State Circuits Conference, Digest of Technical Papers", pp. 152 and 153, describes an electrically erasable memory matrix comprising memory cells arranged in n rows and m columns. Each of the memory cells contains a tunnel injector which is capable of letting electrons tunnel through a sufficiently thin oxide layer in both directions with respect to an electrically floating storage gate. The injector of each memory cell is connected to a first bit line via the source-drain line of a memory transistor and to a second bit line via the source-drain line of a select transistor, while the control gate of the memory transistor is connected to a programming line. The gate of the select transistor is connected to a row selecting line via which, in a row-wise manner, the n memory cells of each row can be selected. The invention deals with a memory cell of a similar design employing an electrically floating storage gate.

For solving the already previously mentioned problem of reducing the dissipated power it is known to realize the periphery of the memory matrix in accordance with the known CMOS technology with the aid of CMOS gates. Such a solution is described in the "1982 IEEE International Solid-State Circuits Conference, Digest of Technical Papers" (February 1982), pp. 110 and 111. This conventional memory matrix, however, has two properties which do not yet correspond to the desired properties of a pure CMOS circuit:

(1) when reading stored data, the direct current consumed exceeds the reverse current level customary with CMOS circuits; and (2) the voltage applied to the injector during the zero writing (Wo), effecting a tunneling of electrons from the storage gate into the injector, does not reach the full value of the available programming voltage Vp, but remains therebelow by the amount of the threshold voltage Ut of the select transistor plus the substrate effect voltage.

SUMMARY OF THE INVENTION

It is one object of the invention to provide a floating-gate memory cell which, in all functions, such as programming, reading and writing, has the desirable properties of a pure CMOS circuit. This implies that during the readout of stored data, the DC power is no greater than that caused by the reverse currents, and further that the cell during zero writing shall permit the supply of the full available programming voltage to the injector.

Therefore, it is another object of the invention to provide a floating-gate memory which is capable of operating with a programming voltage which is lower than was possible hitherto.

An electrically programmable memory cell in accordance with the invention, contains a source-drain series arrangement of a field-effect select transistor arrangement and a complementary pair of memory transistors arranged between a first bit line and a second bit line. The pair of memory transistors comprises a common electrically floating storage gate and a common control gate which is connected to one programming line. Each of the electrodes of the select transistors is connected to the row selecting line associated therewith. The drain regions which are connected to one another, are lead to a read line. The memory cell according to the invention permits reading without requiring any significant DC power, and programming by using the complete programming voltage as available.

BRIEF DESCRIPTION OF THE DRAWINGS

The invention will be better understood from a reading of the following detailed description in conjunction with the drawings in which:

FIGS. 7 and 8 show the design of memory cells as shown in FIGS. 1 or 3, respectively, partly in top views, onto a memory matrix.

DETAILED DESCRIPTION

As can be seen from FIGS. 1 to 4, the series arrangement of four field-effect transistors between the first bit line X and the second bit line Y is common to all embodiments of the memory cell according to the invention. The two inner transistors Tn2 and Tp2 are a complementary pair of memory transistors which, with their drain electrodes are connected to one another in the center point of the series arrangement and to a read line L which is common to the respective matrix column. The polysilicon gate electrodes thereof are connected to one another, isolated as a common storage gate Fg with respect to the surroundings, and are capacitively coupled to the control electrode G arranged thereabove, which is common to the respective row. They preferably consist of an n-doped polysilicon.

Also common to all embodiments is that the outwardly lying sheet transistors Tn1 and Tp1 of the series arrangement, as regards their conductivity types, are in agreement with the respective neighboring memory transistors Tn2 or Tp2 respectively, and that they are controlled via separate row lines Zn and Zp.

It is further common to all embodiments that the n-doped island-shaped substrate regions Wn are arranged in rows, but are electrically connected among each other, and are jointly controlled in terms of potential with respect to the entire memory matrix.

The memory cell is programmed by recharging the storage gate Fg with the aid of a tunneling current which, at a sufficiently high field intensity, flows through the very thin (approximately 10 to 20 nm) tunnel oxide of an injector device below the storage gate.

Figure 1:
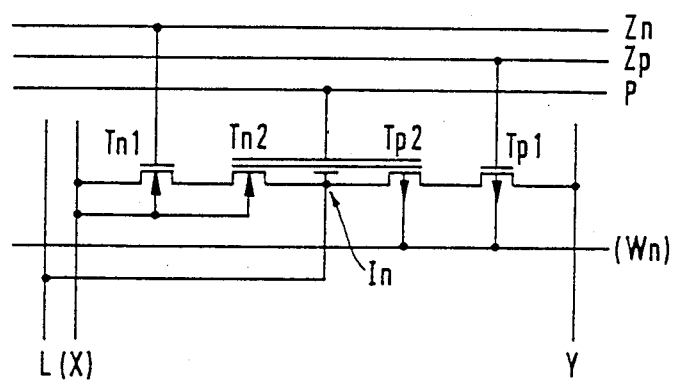
FIG. 1 shows the circuit construction of a first embodiment of an electrically programmable memory cell according to the invention.
Figure 2:
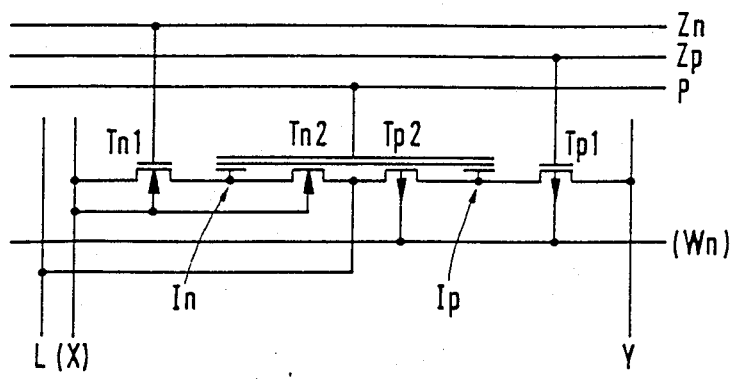
FIGS. 2, 3 and 4 each show a circuit construction of three further types of embodiment of the memory cell according to the invention.
Figure 3:
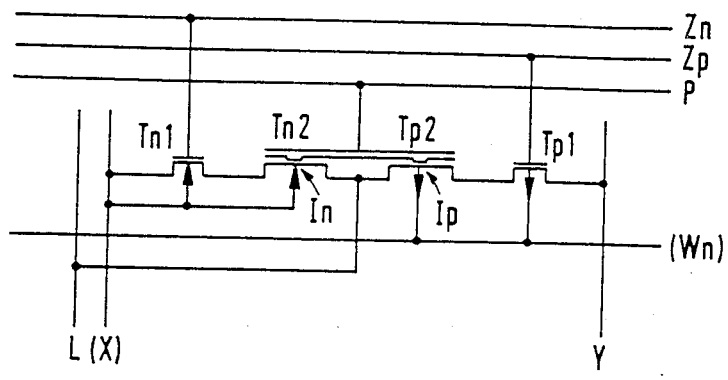
Figure 4:
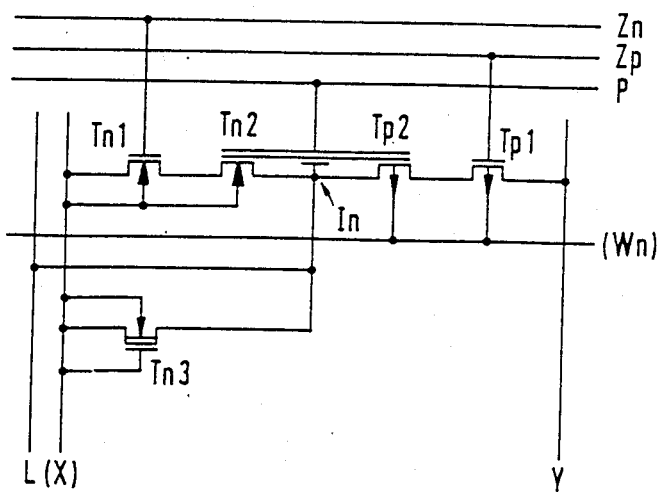

The injector device is arranged within the area of the storage gate Fg and may consist of one injector In as shown in FIGS. 1 and 4 or two injectors In and Ip as shown in FIGS. 2 and 3. The injector In is positioned with its tunnel oxide layer in any case on the n-channel side of the series arrangement, i.e., within the source, drain or channel region of the n-channel memory transistor Tn2. Accordingly, the injector Ip is arranged on the p-channel side within the source, drain or channel region of the p-type channel memory transistor Tp2.

Figure 6:
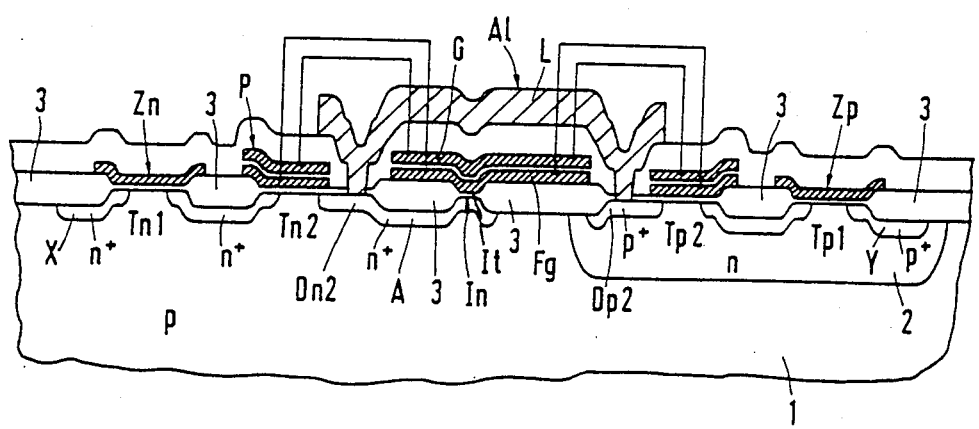
FIG. 6 shows the monolithic integration of a memory cell as shown in FIG. 1, in a partly cross-sectional view.

In the embodiments shown in FIGS. 1 and 4, in which the injector device is arranged between the two memory transistors Tn2 and Tp2 in the center point of the circuit, there is provided one individual injector In at the drain region Dn2 of the n-type type channel memory transistor Tn2, as is illustrated in FIGS. 6 and 7. In this type of embodiment, the injector In with its tunnel oxide It is designed on an extension A of the drain region Dn1. Such an n-type injector performs the "one"-writing W1 as well as the "zero"-writing Wo, because on both sides of the tunnel isolating layer It there is provided n-doped silicon, with the n-polysilicon of the storage gate Fg being arranged thereabove, and the monocrystalline n-type silicon therebelow. These n-doped semiconductors are capable of sending tunnel electrons in both directions through the tunnel oxide which consists preferably of a thermally grown silicon dioxide and has a thickness ranging between 10 and 20 nm.

During the Wo-writing, the CMOS memory cell according to the invention permits the switching of the full programming voltage Up as applied to the second bit line Y, up to center point of the circuit where the read line L branches off. Likewise, during the W1-writing, the zero potential Uss can be switched from the first bit line X, via the n-channel transistors Tn1 and Tn2 to the center point. Therefore, it is sufficient to provide one single injector at the center point. This, however, does not apply to the embodiments of FIGS. 2 and 3.

In the embodiment of FIG. 2, the injector device consists of a first injector In and of a second injector Ip, each arranged between a memory transistor and a select transistor of the same type. Relative thereto, the injector In performs the W1-writing, with electrons flowing into the storage gate Fg, while the injector Ip is in charge of the Wo-writing, with the electrons flowing from the storage gate, consisting of n-doped polysilicon, into the p-doped substrate region 2 arranged therebelow.

In the embodiment of FIG. 3, each time one injector is accommodated within the channel region of each of the two memory transistors Tn2 and Tp2. During the W1-writing, the channel of the n-channel memory transistor Tn2 is rendered conductive and is therefore capable of resupplying the electrons required for the tunneling current.

In all of the embodiments of the memory cell according to the invention, the gate electrodes of the n-channel select transistors Tn1 are arranged row-wisely on the row selecting line Zn, and those of the p-channel select transistors Tp1 are connected row-wisely on the row selecting line Zp.

Accordingly, together with the programming line P, the memory cell has altogether three word lines. Via these three word lines and via the second bit line Y there is effected the row or columnwise control of the memory cells within the memory matrix for performing the following functions:

row-wise erase by the "one"-writing W1, row-wise data input by the "zero"-writing Wo of individual bits into the rows.

row-wise data output via the read line L, and standby St.

Figure 5:
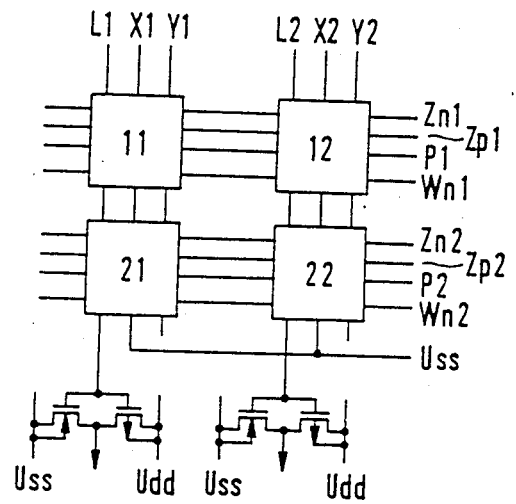
FIG. 5 illustrates the use of memory cells according to FIGS. 1, 2, 3 and 4 with a programmable matrix.

Table I, by way of example, shows a programming scheme relating to the rows and columns of a 2×2 memory matrix employing four CMOS memory cells 11, 12 21 and 22 according to the invention as shown in FIG. 5.

TABLE I

| Cell | 11 | | | | 12 | | | | 21 | | | | 22 | | | |
|---|---|---|---|---|---|---|---|---|---|---|---|---|---|---|---|---|
| Function | Zn1 | Zp1 | P1 | Y1 | Zn1 | Zp1 | P1 | Y2 | Zn2 | Zp2 | P2 | Y1 | Zn2 | Zp2 | P2 | Y2 |
| W1(11,12) | Udd | Udd | Up | Uss | Udd | Udd | Up | Uss | Udd | Udd | Uss | Uss | Udd | Udd | Uss | Uss |
| Wo (11) | Uss | Uss | Uss | Up | Uss | Uss | Uss | Uss | Udd | Up | Uss | Up | Udd | Up | Uss | Uss |
| R (11,12) | Udd | Uss | Uss | Udd | Udd | Uss | Uss | Udd | Uss | Udd | Uss | Udd | Uss | Udd | Uss | Udd |
| St | Uss | Uss | Uss | Uss | Uss | Uss | Uss | Uss | Uss | Uss | Uss | Uss | Uss | Uss | Uss | Uss |

In Table I there are shown in the "Function" column, the following abbreviations:

W1 (11, 12) stands for "erase row 1",

Wo (11) stands for "write row 1",

R (11, 12) stands for "read row 1", and

St stands for "standby" (wait).

In addition thereto, Table II shows the potentials of the substrate regions Wn associated with each of the functions, and which are the same with respect to all rows of the matrix.

TABLE II

| Function | X | Wn |
|---|---|---|
| W1 | Uss | Uss |
| Wo | Uss | Up |
| R | Uss | Udd |
| St | Uss | Uss |

The lines X and Wn, which are listed in Table II, are shown in parentheses in FIGS. 1 to 4, thus indicating that they are not assigned in a row-or columnwise manner, but supply all cells with the same potential, depending on the respective function.

In practice, typical voltage values are as follows:

Up=20 V

Udd=5 V

Uss=0 V.

The voltage supply during the programming and the reading is controlled via the select transistors Tn1 and Tp1.

During the erase W1, the select transistors Tn1 are switched to the conducting state in the addressed row by applying Udd to the row selecting line Zn, whereas the select transistors Tp1 remain in the non-conducting state when Udd is applied to the row selecting line Zp. Therefore, the zero potential of the first bit line X is routed via Tn1 and Tn2 to the injector I. When Up is applied to the control gate G, this raises the potential of the storage gate by a capacitive coupling to almost the same level, causes Tn2 to be rendered conductive, independently of its programming state, and thus produces in all embodiments of the memory cell the necessary field intensity at the thin tunnel oxide of the injector, in order to permit electrons to tunnel into the storage gate. These negative charges in the storage gate displace the effective threshold voltages of the memory transistors Tn2 and Tp2 into the positive direction by $\Delta Ut$: all cells of the row are erased.

During the writing operation Wo, the select transistor Tn1 in the addressed row is rendered non-conductive and the select transistor Tp1 is rendered conductive. Considering that the substrate region Wn is simultaneously raised to Up, the full voltage Up can be applied to the injector, from the second bit line Y, i.e., the source side of Tp1, through the select transistor Tp1 and, if so required, also through the select transistor Tp2. The potential Uss=0 at the control gate G, by way of a capacitive coupling via the programming line P, brings at the same time the potential of the storage gate Fg correspondingly down thus producing the necessary field intensity at the injector in order to permit electrons to tunnel downwardly from the storage gate Fg to the injector. Only those cells of the addressed row whose bit line Y is applied to Up are thus written by lowering the threshold voltage by $\Delta Ut$ in proportion to the number of the flown-off electrons. To the remaining cells of the addressed row and via the associated second bit line Y, there is applied Uss=0. In the course of this, the potential of the injector remains at a positive value which corresponds to the amount of the threshold voltage of the select transistor Tp1. This value is small enough for preventing a programming which is unwanted in this case.

During the read operation R both select transistors Tn1, Tp1 are rendered conductive in the addressed row, so that the CMOS inverter consisting of the memory transistors Tn2 and Tp2, is supplied with voltage. At the output of this memory or storage inverter which is connected to the read line, there will then occur the potential Udd in cases where the cell is erased, that is, when the storage gate which is common to both the memory transistors Tn2 and Tp2, following a W1-programming, shows to have a negative charge surplus. In the reverse case, the potential Uss=0 occurs on the read line in cases where the cell was last programmed by the Wo-writing operation and, consequently, then the storage gate has a positive charge surplus.

In the non-addressed rows, both select transistors are rendered non-conductive. Therefore, in the non-addressed rows the potential of read line of the column is not disturbingly affected.

With respect to nonvolatile memory cells it is an important problem to avoid data losses in the memory matrix due to any unintended programming or erasing operations in non-addressed rows or columns. Such a loss of data can occur slowly and gradually owing to the accumulating effect of many programming operations in neighboring rows or cells. There may also appear a certain loss of data after a very great number of data readout operations.

To avoid this, it is necessary that in cells of the memory matrix which are not being programmed, there does not appear an excessively high potential difference between the storage gate and the injector electrode lying therebeneath.

The potential of the electrically floating storage gate Fg depends on the programming state thereof, and is referred to the potential of the control gate G, and is almost equal in magnitude to the threshold voltage variation $\Delta Ut$ as effected by the programming, but of opposite sign. The storage gate potentials of erased and written cells, accordingly, in the case of a symmetrical programming, differ by about $/\Delta Ut/$ or $+/\Delta Ut/$ from the potential of the control gate G. Therefore, the optimum state safeguarding a good data retention is given when the potential of the injector is in the center between the two storage gate potentials of written and erased cells, i.e., when it is equal to the potential of the control gate G.

In the case of the non-addressed rows, the programming line P as can be seen from Table I, is generally applied to the zero potential Uss. During the Wo-writing operations, when the substrate region Wn is applied to Up, the cells of the non-addressed rows on the p-type channel side are blocked by the potential Up as applied to word line Zp. Since now the substrate region Wn, during the Wo-programming, is applied to Up, the potential at the injector, in the case of erased cells, adjusts itself, on the one hand, in accordance with the competition between the reverse current of the n+p-junction in the p-type substrate and, on the other hand, the reverse current of the p+n-junction in the n-type substrate region Wn, with this corresponding to a shearing of the two reverse current characteristics. In order to be quite sure that the desired zero potential occurs at the injector, care has to be taken that the reverse current of the n+p-junction, which surrounds the injector distinctly predominates over the reverse current of the p+n-junction of the drain region Dp2 of the transistor Tp2.

Therefore, in the memory cell according to the invention, i.e., in its types shown in FIGS. 1 to 3, it is advantageous to produce within the area of the n+p-junction as surrounding the n-type injector, and by way of an ion implantation process, recombination centers which serve to increase the reverse current of the n+p-junction to such an extent as to exceed the reverse current of the p+n-junction in the drain region Dp2 of Tp2 by a factor of about 30 to 100.

In the memory cell according to the invention as shown in FIG. 4, this problem is solved in a different way. The drain side of the memory transistor Tn2 is connected via a field-effect transistor Tn3 of the depletion type, directly to the first bit line X which is applied to Uss=0. The gate electrode of this transistor is likewise connected to the first bit line X, so that the transistor is connected as a source of constant current.

By a selective ion implantation within the channel area of Tn3, the threshold voltage of the transistor is displaced in such a way that its pinch-off current will lie in the so-called subthreshold area. With the aid of the ion implantation, the pinch-off current is adjusted in such a way that it will exceed the reverse current of the p+n-junction on the drain side of Tp2 by the factor of about 30 to 100. Depending on the basic doping of the p-doped substrate, either boron, arsenic or phosphorus ions are used for this implantation.

The type of memory cell as shown in FIG. 1, can be realized as shown in FIGS. 6 and 7. The top view of FIG. 7 onto a part of a memory matrix corresponds to the partly sectional view as shown in FIG. 6, with the exception of the position of the Al-contact on the n-type channel side relating to the tunnel injector In. One row of memory cells is arranged between the limiting lines 8 and 9. The memory cells of the neighboring row are designed or arranged mirror-invertedly in relation to these lines.

This Al-contact is arranged in the type of embodiment as shown in FIG. 6, between the two drain regions Dp2 and Dn2, whereas in the modification as shown in FIG. 7, it is arranged on the extension A of the drain region Dn2 between the area effective as the drain region and the diagonally crossed contacting area of the read line L.

In manufacturing the embodiment as shown in FIGS. 6 and 7, one starts from a p-doped semiconductor body 1. Superficially into body 1 there is first diffused the n-doped substrate region 2 and, thereafter, successively the n- and the p-doped source and drain areas by way of ion implanation followed by a diffusion within one area of the substrate 1 or within the area of substrate region 2. Subsequent thereto, the SDG-areas are covered with an oxidation masking layer of silicon nitride, counteracting the oxidation of the silicon, as is known from "IEEE Transactions on Electron Devices", Vol. 13 (July 1966), pp. 561 through 563. By way of thermal oxidation, the thick oxide 3 is produced outside the aforementioned areas. Upon removal of the oxidation masking layer, and in the course of two oxidation processes, and following a selective etching of the tunnel insulating layer It, the gate oxide is first produced in the gate areas of the transistors Tp1, Tp2, Tn2 and Tn1, and thereafter within the area of the injector, in a thickness ranging between 10 and 15 nm, by way of oxidation. After this, the arrangement is covered with a first layer 6 of n-doped polycrystalline silicon, from which the row selecting lines with the gate electrodes of the transistors and the storage gate Fg are etched out. The storage gate Fg and the control gate G are provided with the recesses 4 and 5 (FIG. 7).

Following a further thermal oxidation of the exposed polysilicon surface of the first layer 6, there is again deposited over the entire arrangement a second layer 7 of polycrystalline silicon, from which the control gate G is worked out in a row-wise manner continuously with the control gates of the neighboring memory cell, so that this layer can be used as a programming line P.

Following the deposition of a foreign oxide layer, and vertically in relation to the row selecting lines Zn2 and Zp2, the read line L contacting the drain regions Dn2 and Dp2, and the bit line Y contacting the source region of the select transistor Tp1, are etched out of a layer of aluminum deposited over the arrangement.

The n-doped substrate regions 2 of the memory cells are led in a row-wise manner transversely through the memory matrix, but are electrically connected to one another outside the matrix. The first bit line X is produced by way of diffusion in the course of embodying the n-doped regions, and extends in this type of embodiment, in the row direction. To bit line X potential Uss is applied.

FIG. 8 shows a mask layout of the type of embodiment as shown in FIG. 3 which has one injector In and Ip each in the center of the channel areas of the two memory transistors Tn2 and Tp2. In this type of embodiment two conducting layers 6 and 7 of polycrystalline silicon are deposited. From the first deposited one there are etched out the row selecting lines Zp2 and Zn2 extending in a direction transversely in relation to the bit lines X and Y and, at the same time, the storage gate electrode Fg.

In FIG. 8, ion implantations have been carried out in manufacturing the regions in accordance with the standard silicon gate process and therefore unlike the embodiment of FIG. 7, the lines of the subdiffusions are missing. The memory cells of the neighboring memory cells are arranged in a mirror-inverted manner around the limiting lines 8 and 9 of the shown memory cell. The control gates G with the programming lines P connecting them, are etched out of the topmost deposited layer 7 of polycrystalline silicon. The structured lower layer 6 of n-doped polycrystalline silicon is used as a masking for the two implantation processes required for manufacturing the n+- and P+- regions which are not differently shown in FIG. 8. A separate photomask is used for manufacturing the two tunnel insulating layers Itn and Itp of the two injectors In and Ip.

The ion implantation for increasing the reverse current of the n+p-junction in the surroundings of the n-type injector is carried out in both process examples, either before or after the gate oxidation.

What is claimed is:

1. Electrically programmable memory cell forming part of a memory matrix and which, in the form of a source-drain series arrangement of field-effect transistors, is composed of a coupling part and of a storage part comprising an electrically floating storage gate (Fg), said storage gate being capacitively couple to a control gate (G) and capable of being recharged by means of an injector device with a tunnel junction, wherein said series arrangement is located between a first bit line (X) and a second bit line (Y), and said control gate (G) is connected to a programming line (P);

characterized in that, said storage part comprises a pair of complementary field-effect memory transistors (Tn2, Tp2), with the drain regions thereof being connected to one another in the center point of the series arrangement by a conducting bridge;

the storage gates of the memory transistors (Tn2, Tp2) are connected to one another to form said storage gate (Fg) and comprise a continuous layer of polysilicon which is capable of being recharged by means of said injector device (I, In, Ip);

said control gate comprises the control gates (G) of the memory transistors (Tn2, Tp2) connected to one another;

each of said memory transistors (Tn2, Tp2) having its source side connected to the drain region of a select transistor (Tn1, Tp2) of the same conductivity type;

said select transistors (Tn1, Tp1) form the coupling part of the series arrangement, and each has its source side connected to one of said bit lines (X, Y) and each has its gate electrode connected to one of two word lines (Zn, Zp);

the drain regions of said memory transistors (Tn2, Tp2) are connected in the center point of said series arrangement to a read line (L) which is common to one matrix column;

the n-type channel transistors (Tn1, Tn2) are arranged in a p-doped substrate, and that the p-type channel transistors (Tp1, Tp2) are arranged in rows each said row of p-type channel transistors being formed in an n-doped substrate region (2), with said substrate region being divided in accordance with the rows; and the n+p-junction between the n-doped drain region of the n-type channel memory transistor (Tn2) and the p-doped substrate has a reverse current which is greater by a factor of 30 to 100 than the p+n-junction between the p-doped drain region of the p-type channel memory transistor (Tp2) and the n-doped substrate region (Wn) when a voltage of 20 V is applied to said n-doped substrate region with respect to said first bit line (X).

2. A memory cell in accordance with claim 1, further characterized in that said injector device comprises a first injector (In) which is arranged either within the n-doped drain region of the n-type channel memory transistor (Tn2) or in an extension (A) of the drain region (Dn) thereof;

said first injector (In) having a small surface area and having a thin tunnel insulating layer (It) between the surface of said drain region (Dn) and said storage gate (Fg).

3. A memory cell in accordance with claim 2, further characterized in that said injector device, comprises a second injector (Ip) which is arranged either within the p-doped drain region of the p-type channel memory transistor (Tp2) or in an extension of the drain thereof.

4. A memory cell in accordance with claim 1, further characterized in that said injector device contains a first injector (In) which is arranged either within the n-doped source region of one of said memory transistors (Tn2) or in an extension (A) thereof and, contains a second injector (Ip) which is arranged either within the p-doped source region of the other of said memory transistors (Tp2) or in an extension (A) thereof, with said first and second injectors (In, Ip) each being defined by a small surface type of thin tunnel insulating layer (Itn, Itp) between the surface of the source regions and said storage gate (Fg).

5. A memory cell in accordance with claim 1, further characterized in that said injector device comprises a first injector (In) which is arranged within the channel region between the source region and the drain region of the n-type channel memory transistor (Tn2) and, in addition thereto, comprises a second injector (Ip) which is arranged within the channel region of the p-type channel memory transitor (Tp2), and that said first and second injectors (In, Ip) are each defined by a thin tunnel insulating layer (Itn, Itp) at the respective points of the channel regions of the gate oxide.

6. A memory cell in accordance with claim 1, further characterized in that the enlarged reverse current is produced by way of local ion implantations with foreign ions.

7. A memory cell in accordance with claim 2, further characterized in that the enlarged reverse current is produced by way of local ion implantations with foreigns ions.

8. A memory cell in accordance with claim 3, further characterized in that the enlarged reverse current is produced by way of local ion implantations with foreign ions.

9. A memory cell in accordance with claim 4, further characterized in that the enlarged reverse current is produced by way of local ion implantations with foreign ions.

10. A memory cell in accordance with claim 5, further characterized in that the enlarged reverse current is produced by way of local ion implantations with foreign ions.

11. A memory cell in accordance with claim 2, further characterized in that the n-doped drain region of the n-type channel memory transistor (Tn2) is connected to the n-doped source region of the n-type channel select transistor (Tn1) via an n-channel field-effect transistor (Tn3) of the depletion type, with the gate electrode thereof likewise being connected to the source region of the n-type channel select transistor (Tn1), and with the pinch-off current thereof being greater than the reverse current of the p+n-junction of the p-doped drain region of the p-type channel memory transistor (Tp2).

12. A memory cell in accordance with claim 3, further characterized in that the n-doped drain region of the n-type channel memory transistor (Tn2) is connected to the n-doped source region of the n-type channel select transistor (Tn1) via an n-channel field-effect transistor (Tn3) of the depletion type, with the gate electrode thereof likewise being connected to the source region of the n-type channel select transistor (Tn1), and with the pinch-off current thereof being greater than the reverse current of the p+n-junction of the p-doped drain region of the p-type channel memory transistor (Tp2).

13. A memory cell in accordance with claim 11, further characterized in that the pinch-off current of the n-type channel field-effect transistor (Tn3) is adjusted by way of ion implantation such that it is 30 to 100 times greater than the reverse current of the p+n-junction of the p-doped drain region of the p-type channel memory transistor (Tp2).

14. A memory cell in accordance with claim 12, further characterized in that pinch-off current of the n-type channel field-effect transistor (Tn3) is adjusted by way of ion implantation such that it is 30 to 100 times greater than the reverse current of the p+n-junction of the p-doped drain region of the p-type channel memory transistor (Tp2).

15. A memory cell in accordance with claim 2, further characterized in that the tunnel insulating layer consists of thermally grown silicon dioxide and has a thickness ranging between 10 and 20 nm.

* * * * *